United States Patent
Castro et al.

(10) Patent No.: US 8,891,319 B2
(45) Date of Patent: Nov. 18, 2014

(54) VERIFY OR READ PULSE FOR PHASE CHANGE MEMORY AND SWITCH

(75) Inventors: Hernan Castro, Shingle Springs, CA (US); Timothy C. Langtry, San Jose, CA (US); Richard Dodge, Santa Clara, CA (US); Ilya Karpov, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 654 days.

(21) Appl. No.: 12/956,853

(22) Filed: Nov. 30, 2010

(65) Prior Publication Data

US 2012/0134202 A1    May 31, 2012

(51) Int. Cl.
  *G11C 7/06*    (2006.01)
  *G11C 13/00*   (2006.01)

(52) U.S. Cl.
  CPC ........ *G11C 13/0004* (2013.01); *G11C 13/0064* (2013.01); *G11C 13/004* (2013.01); *G11C 2013/0052* (2013.01); *G11C 13/0061* (2013.01)

USPC ............ 365/189.15; 365/189.05; 365/189.07; 365/189.09; 365/148; 365/163; 365/196

(58) Field of Classification Search
  USPC .......... 365/148, 163, 189.15, 189.05, 189.07, 365/189.09, 196, 191
  See application file for complete search history.

(56) References Cited

U.S. PATENT DOCUMENTS

| | | | |
|---|---|---|---|
| 7,304,889 B2 * | 12/2007 | Goldman et al. | 365/185.03 |
| 7,359,231 B2 * | 4/2008 | Venkataraman et al. | 365/148 |
| 7,849,712 B2 * | 12/2010 | Parkinson | 65/148 |
| 8,130,536 B2 * | 3/2012 | Karpov et al. | 365/163 |

* cited by examiner

*Primary Examiner* — Andrew Q Tran
(74) *Attorney, Agent, or Firm* — Knobbe, Martens, Olson & Bear LLP (57) ABSTRACT

Embodiments disclosed herein may relate to applying verify or read pulses for phase change memory and switch (PCMS) devices. The read pulses may be applied at a first voltage for a first period of time. A threshold event for the phase change memory cell may be detected during a sense window. The sense window may close after the expiration of the first period of time for which the read pulses are applied.

16 Claims, 11 Drawing Sheets

VERIFY OR READ PULSE FOR PHASE CHANGE MEMORY AND SWITCH

BACKGROUND

Subject matter disclosed herein relates to phase change memory and switch devices, and may relate more particularly to verify or read pulses for phase change memory and switch devices.

Integrated circuit devices, such as non-volatile memory devices, for example, may be found in a wide range of electronic devices. For example, non-volatile memory devices may be used in computers, digital cameras, cellular telephones, personal digital assistants, etc. Phase change memory represents an example type of non-volatile memory device. Phase change memory devices may be characterized at least in part by how information is stored in individual memory cells in that a state of a particular memory cell depends on a state of the memory cell material. An amorphous, non-crystalline state may represents a binary value of '0', also referred to as a "reset" state, and a crystalline state of the memory cell may represent a binary value of '1', also referred to as a "set" state. In a phase change memory, whether a memory cell may be read or verified as being in a set or reset state may depend, at least in part, on a sensed voltage or current resulting from a verify or read voltage pulse applied to the phase change memory cell.

BRIEF DESCRIPTION OF THE DRAWINGS

Claimed subject matter is particularly pointed out and distinctly claimed in the concluding portion of the specification. However, both as to organization or method of operation, together with objects, features, or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, integrated circuit devices, such as non-volatile memory devices, for example, may be found in a wide range of electronic devices. For example, Phase Change Memory (PCM) or Phase Change Memory and Switch (PCMS) non-volatile memory devices may be used in computers, digital cameras, cellular telephones, personal digital assistants, etc. For PCM and PCMS memory devices, a state of a particular memory cell may depend on a phase of the memory cell material, as discussed below, for example. A PCMS memory device may be differentiated from a PCM memory device by an array of switches fabricated out of material similar to that of the memory cells, in one or more embodiments. Such switches may also be referred to as selectors, in an embodiment. An array of switches may serve to isolate individual memory cells in an array of memory cells. By contrast, a PCM memory device may include switches or selectors comprising bi-polar devices formed in a CMOS layer.

Also, for example PCMS memory devices, a memory cell may comprise chalcogenide glass, in an embodiment. A PCMS memory cell may be made to switch between different states with an application of sufficient heat. For example, a "set" state, representing a binary value of '1', in an embodiment, may correspond to a substantially crystalline, substantially conductive state for a material of a memory cell. A "reset" state, on the other hand, representing a binary value of '0', in an embodiment, may correspond to a substantially amorphous, relatively resistive state of a memory cell. Further, a threshold voltage level for a PCMS memory cell in a set state may be lower than that for a PCMS memory cell in a reset state, in an example embodiment.

For a read operation or a verify operation from a PCMS device, whether a particular memory cell may be read or verified as being in a set or reset state may depend, at least in part, on a sensed voltage or current resulting from a verify or read voltage pulse applied to the PCMS cell. As discussed more fully below, for an embodiment, to sense a state of a PCMS cell for a verify or read operation, a read or verify pulse may be applied to a PCMS memory cell. The read or verify pulse may reach a specified voltage level for a specified period of time, for an embodiment. Also for an embodiment, a threshold event may be detected for the PCMS cell during a sense window, described more fully below. For an embodiment, a "threshold event" as it relates to a PCMS cell may refer to a moment in time at which the cell begins to substantially conduct current in response to an application of a voltage pulse of sufficient magnitude or duration, as also described more fully below.

Also, for an embodiment, the sense window may close after an expiration of the specified period of time related to the applied read or verify voltage pulse. One or more example embodiments described herein may relate to one or more adjustments that may be made to the timing of a sense window to help guard against false reads during verify or read operations.

Figure 1:
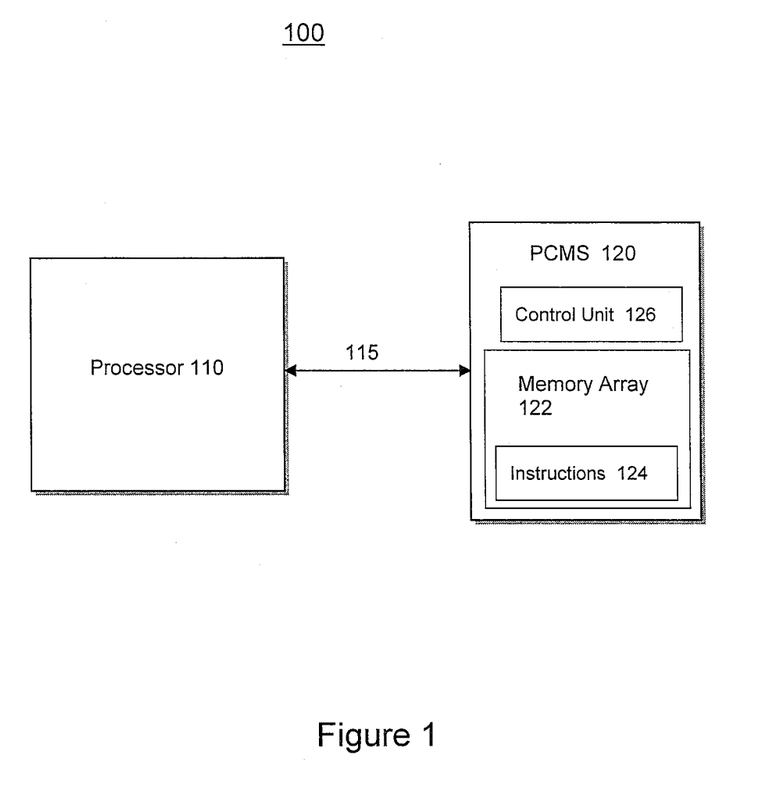
FIG. 1 is a schematic block diagram depicting an example embodiment of a system including an example embodiment of a phase change memory and switch (PCMS) device.

FIG. 1 is a schematic block diagram depicting an example embodiment of a system 100 including an example embodiment of a PCMS device 120. In an embodiment, PCMS 120 may comprise an array of memory cells 122 that may be implemented in accordance with one or more embodiments disclosed herein. PCMS 120 may be coupled in an embodiment to a processor 110 by way of an interconnect 115. System 100 is presented in FIG. 1 at least in part in order to provide one potential context for a phase change memory device, and embodiments in accordance with claimed subject matter are not limited to the example depicted in FIG. 1.

Figure 3:
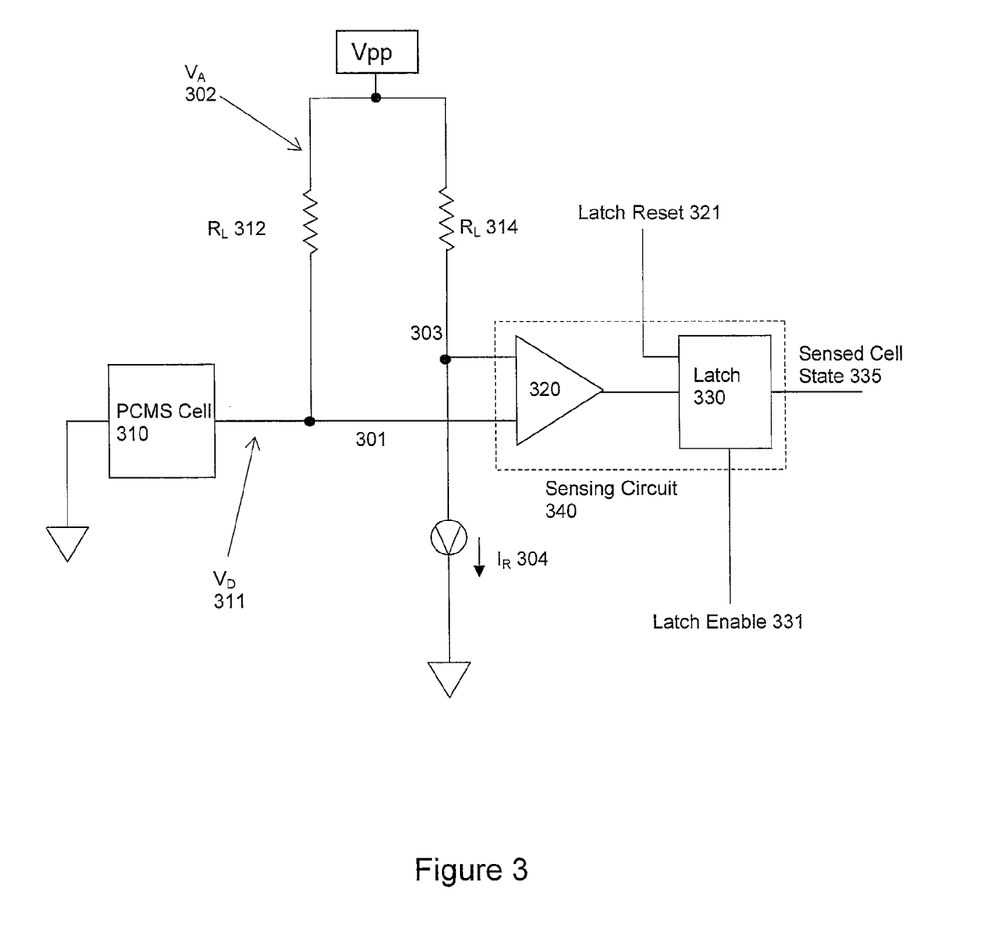
FIG. 3 is a schematic block diagram depicting an example embodiment of a PCMS cell and sensor circuit.

PCMS 120 in an embodiment may comprise a control unit 126, as well as memory array 122. Memory array 122 for an embodiment may comprise an array of PCMS cells. Also in an embodiment, memory array 122 may store instructions 124 that may include one or more applications which are executable by processor 110. In an embodiment, processor 110 may transmit a memory access command to PCMS 120. Control unit 126 may, for an embodiment, access one or more memory cells of memory array 122 at least in part in response to receiving the memory access command from processor 110. In an embodiment, a memory access command may comprise a memory read command targeted to one or more cells from PCMS array 122. Further, for an embodiment, a memory access command may comprise a memory verify command. However, these are merely example commands, and the scope of claimed subject matter is not limited in this respect. An example memory read or verify command may comprise sensing a state of one or more cells at least in part by application of a voltage pulse to the cells. A sensing circuit, not shown in FIG. 1 but of which an example is depicted in FIG. 3, may detect whether a threshold event occurs as a result of the application of the voltage pulse. As previously mentioned, an example threshold event may comprise a moment in time at which the cell begins to substantially conduct current in response to an application of a voltage pulse. Such a voltage pulse may have a voltage level and a duration sufficient to result in a PCMS cell in a crystalline state conducting current sufficient to be sensed by a sensing circuit, in an embodiment.

In an embodiment, system 100 may comprise a computing platform. A computing platform may comprise a system or a device that may include an ability to process or store data in the form of signals. Thus, a computing platform, in this context, may comprise hardware, software, firmware, or any combination thereof. Computing platform 100, as depicted in FIG. 1, is merely one such example, and the scope of claimed subject matter is not limited in these respects. For one or more embodiments, a computing platform may comprise any of a wide range of digital electronic devices including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform.

Figure 2:
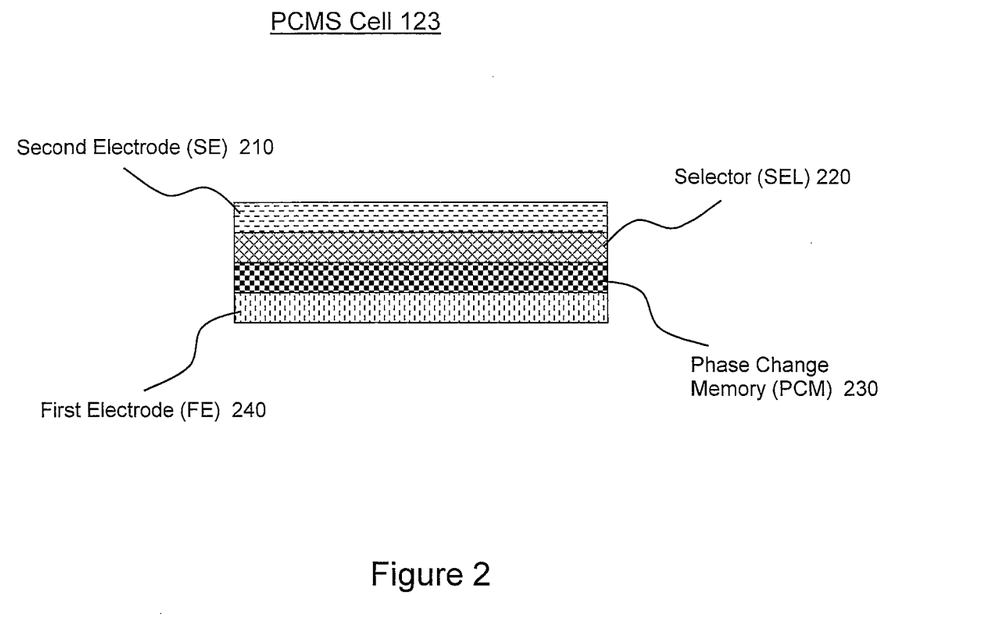
FIG. 2 is an illustration depicting a cross-sectional view of an example embodiment of a PCMS device.

FIG. 2 is an illustration depicting a cross-sectional view of an example embodiment of phase change memory device 123 for PCMS 120. For an embodiment, PCMS cell 123 may be implemented as part of PCMS array 122. In a PCMS memory array, two layers of orthogonal electrically conductive lines may be formed, with one layer of electrically conductive lines formed at the bottom of a memory stack and another layer of electrically conductive lines running in an orthogonal direction formed in a top layer of the memory stack. In an embodiment, the bottom layer of electrically conductive lines for PCMS cell 123 may be referred to as a first electrode (FE) layer 240, and the top layer of electrically conductive lines may be referred to a second electrode (SE) layer 210. Also for an embodiment, and as depicted in FIG. 2, a layer of PCM memory material (230) and a layer of selector material (SEL) 220 may be located between layers FE 240 and SE 210 to form PCMS memory cell 123. However, PCMS cell 123 depicted in FIG. 2 is merely an example, and claimed subject matter is not limited in scope in these respects. Further, it should also be noted that directions or references, for example, up, down, top, bottom, and so on, may be used to facilitate discussion of the Figures, and the scope of claimed subject matter is not limited in these respects.

FIG. 3 is a schematic block diagram depicting an example embodiment of a PCMS cell 310 and sensing circuit 340. In an embodiment, sensing circuit 340 may comprise a comparator 320 and a latch 330. Latch 330 may receive a latch reset signal 321 that may reset the latch to a known state prior to a read or verify operation. Also, for an embodiment, latch 330 may receive a latch enable signal 331 that may enable sensing circuit 340 in accordance with a specified sensing window. In an embodiment latch reset signal 321 and latch enable signal 331 may be controlled by a control circuit. An example control circuit 126 is depicted in FIG. 1, as mentioned above.

Figure 5:
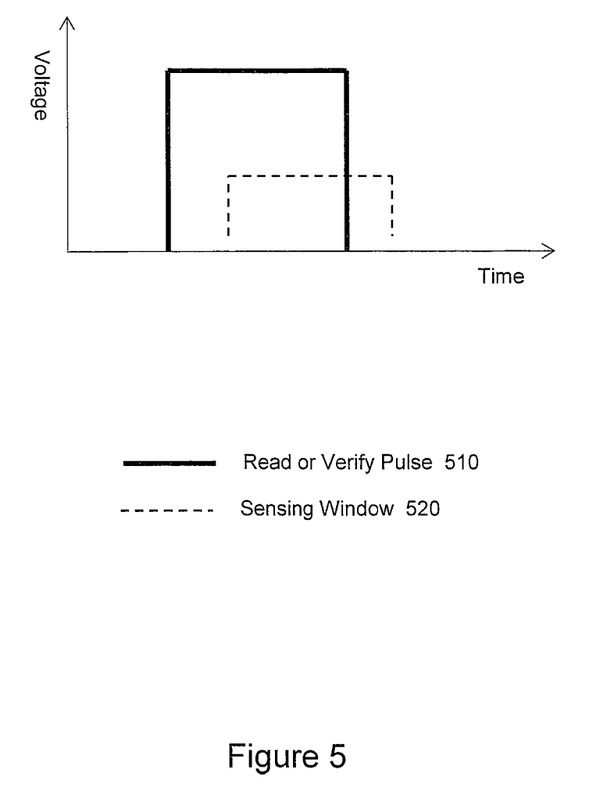
FIG. 5 is an illustration of an example waveform of a read or verify voltage pulse applied to an example embodiment of a PCMS cell and of an example sensing window.
Figure 8:
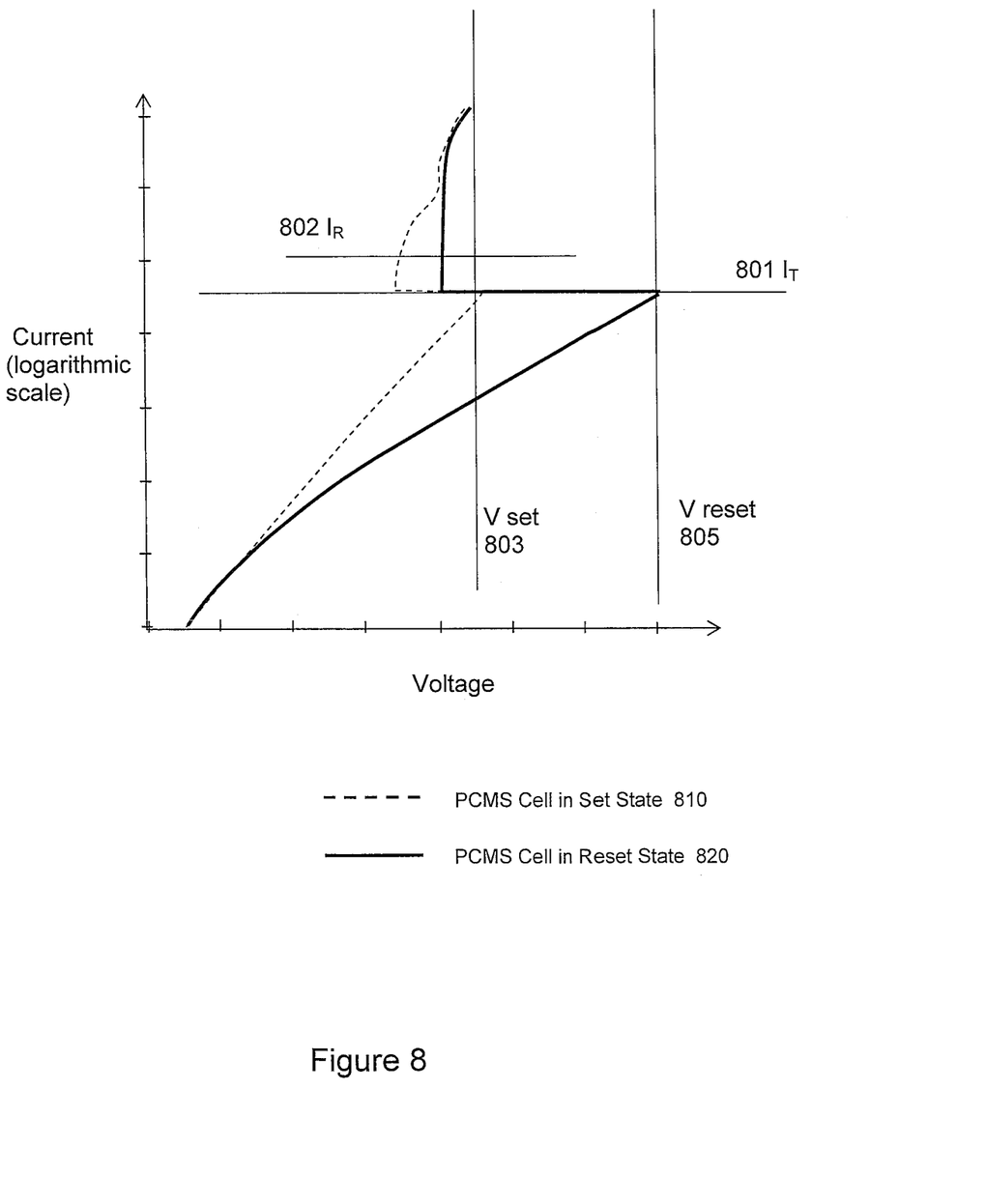
FIG. 8 is a depiction of an example current vs. voltage curve for an example embodiment of a PCMS cell.

To perform a read or verify operation, a control circuit may apply a voltage pulse to a node $V_A$ 302. Example waveforms for such a voltage pulse are depicted in FIGS. 5 and 6 and are discussed below. Also, example current vs. voltage curves for an example embodiment of a PCMS cell is depicted in FIG. 8. As described below, FIG. 8 depicts a threshold current $I_T$ 801 for a PCMS cell, as well as a voltage level Vset 803 at which an example PCMS cell may threshold if previously programmed to a set state. FIG. 8 also depicts a voltage level Vreset 805 at which an example PCMS cell may threshold if in a reset state. Vreset 805 may exceed Vset 803, for an example PCMS cell, such as example cell 310.

For the example embodiment depicted in FIG. 3, the voltage pulse applied to node $V_A$ 302 may have a voltage level between Vset 803 and Vreset 805. In response to the application of the voltage pulse at node $V_A$ 302, PCMS cell 310 may or may not begin to conduct current, depending on whether PCMS cell 310 has been programmed to a substantially amorphous, or reset, state or to a substantially crystalline, or set, state. As can be seen in FIG. 8, for a given voltage, a PCMS cell in a set state may conduct more current than a PCMS cell in a reset state. If PCMS cell 310 is in a substantially amorphous state, relatively little current may conduct through cell 310. Therefore, relatively little current may flow through a load 312, represented in FIG. 3 as resistor 312, and comparator 320 may also experience a voltage similar to $V_A$ at its input at node 301. An additional load 314, through which a reference current $I_R$ 304 may flow, is also depicted as coupling node 303 with node 302, in an embodiment. Reference current $I_R$ 304 may correspond to a reference current 802 depicted in FIG. 8, in an embodiment. Comparator 320 may compare the voltage present at node 301 with a voltage present at node 303, and a result of the compare may be latched at latch 330. The voltage at node 303, for an embodiment, may result at least in part from reference current $I_R$ 304/802 and load 314. In an embodiment, reference current 304/802 may have a level exceeding a threshold current 801 for PCMS cell 310. Therefore, for a case wherein PCMS cell 310 is in a reset state, because relatively little current may flow through load 312 as compared to load 314, a voltage at node 301 may be greater than a voltage at node 303, and comparator 320 may output a binary '0', in an embodiment. Latch 330 may maintain its reset state, in an embodiment, and a sensed cell state signal 335 may reflect a logically low voltage level indicating a binary value of '0'. In an embodiment, a binary value of '0' on sensed cell state signal 335 may indicate that PCMS cell 310 is in a reset state. Of course, the voltage levels, current levels, and binary values described herein are merely examples, and the scope of claimed subject matter is not limited in this respect.

Also, in an embodiment, if PCMS cell 310 is in a set state, current may conduct to a degree through cell 310 in response to an application of a voltage pulse of sufficient magnitude or of sufficient duration at node 302. As mentioned above, the voltage pulse applied to node 302 may exceed Vset 803 and may be less than Vreset 805. Therefore, at least in part in response to the voltage pulse exceeding Vset, PCMS cell 310 may threshold and may begin to conduct a greater amount of current. As current flows through cell 310, comparator 320 may compare a voltage present at node 301 with a voltage present at node 303, and a result of the compare may be latched at latch 330. A voltage at node 303, for an embodiment, may result at least in part from reference current $I_R$ 304/802 and load 314. In an embodiment, reference current 304 may have a current level above the cell threshold current 801. Therefore, for a case wherein PCMS cell 310 is in a substantially crystalline state, because greater current may flow through load 312 as compared to reference current $I_R$ 304/802 flowing through load 314, a voltage drop across load 312 may exceed a voltage drop across load 314, and a resulting voltage at node 301 may be less than a voltage at node 303. At least in part in response to the voltage at node 303 exceeding the voltage at node 301, comparator 320 may output a logically high voltage level indicating a binary in an embodiment. Latch 330 may, at least in part in response to receiving a logically high voltage level from comparator 320, output a binary value of '1'. In an embodiment, a binary value of '1' on sensed cell state signal 335 may indicate that PCMS cell 310 is in a substantially crystalline, or set, state. Again, the voltage levels and binary values described herein are merely examples, and the scope of claimed subject matter is not limited in this respect. Also, although sensing circuit 340 is described as sensing voltage levels, other embodiments in accordance with claimed subject matter may include sensing circuits that sense current levels.

Figure 4A:
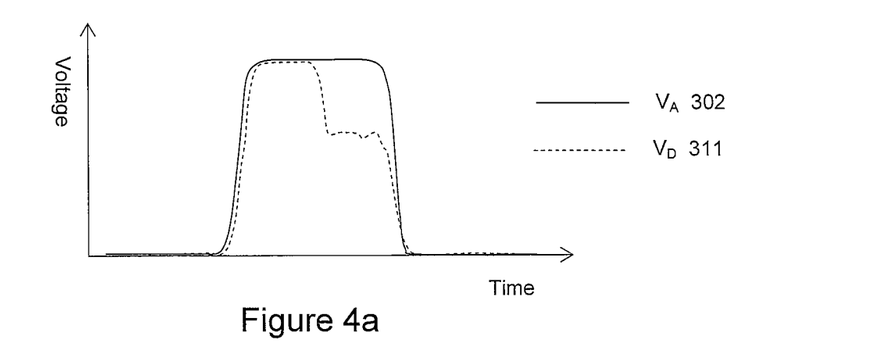
FIG. 4a is an illustration of an example waveform depicting a read or verify voltage pulse applied to an example embodiment of a PCMS cell to sense a state of the cell.

FIG. 4a is an illustration of an example waveform depicting a read or verify voltage pulse applied to an example embodiment of a PCMS cell to sense a state of the cell. As depicted in FIG. 4a, a voltage pulse applied to node 302 is illustrated by a solid line. A dotted line represents a voltage level observed at node 311 during the voltage pulse applied to node 302. In an embodiment, the pulse applied to node 302 may comprise a read or verify voltage pulse applied to a PCMS cell, such as cell 310 depicted in FIG. 3 and described above. In an embodiment, a drop in voltage level observed at node 311 may represent a threshold event for PCMS cell 310. As described previously, in an embodiment, a threshold event for a PCMS cell may represent a point in time at which the memory cell may begin to conduct current.

In observing the waveform represented by the dotted line in FIG. 4a, it may be noticed that a voltage drop occurs approximately in the center of the read or verify pulse observed at node 311. For an embodiment, such a drop in voltage may represent a threshold event for a PCMS cell that may be sensed by a sensing circuit. For this particular example, because a sensing window (not depicted in FIG. 4a, but see FIGS. 5 and 6) may conventionally occur within time boundaries defined by the pulse period, and because the threshold event occurs approximately in the middle of the pulse period, a sensing unit such as sensing circuit 340 may successfully detect the threshold event, and sensed cell state signal 335 may correctly represent the state of PCMS cell 310.

Figure 4B:
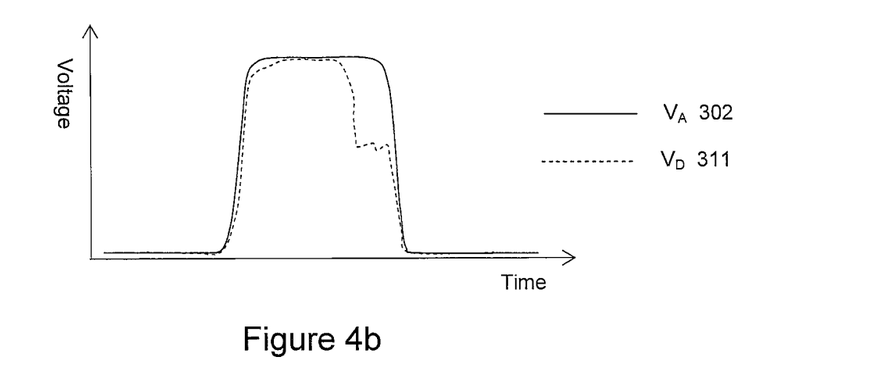
FIG. 4b is an illustration of an example waveform depicting a read or verify voltage pulse applied to an example embodiment of a PCMS cell to sense a state of the cell.

FIG. 4b is an illustration of an example waveform depicting a read or verify voltage pulse applied to an example embodiment of a PCMS cell to sense a state of the cell. As depicted in FIG. 4b, a voltage pulse applied to node 302 is illustrated by a solid line. A dotted line represents a voltage level observed at node 311 during the voltage pulse applied to node 302. For the example of FIG. 4b, it may be noticed that a voltage drop at node 311 occurs approximately at a point in time in a latter half of a period of time defined by the read or verify pulse observed at node 302. For this particular example, because a sensing window (not depicted in FIG. 4b) may occur for an embodiment within time boundaries defined by the pulse period, and because the threshold event occurs approximately in the latter half of the pulse period, a sensing unit such as sensing circuit 340 may successfully detect the threshold event in most cases, and sensed cell state signal 335 may correctly represent the state of PCMS cell 310 in most cases. However, because less time is available for sensing circuit 340 to correctly sense the threshold event, there may be an increased likelihood of the sensing circuit failing to detect the threshold event, and this may further increase a likelihood of an incorrect value being represented at sensed cell state signal 335. Embodiments described herein may guard against a sensing circuit failing to detect a threshold event, as discussed further below.

Figure 4C:
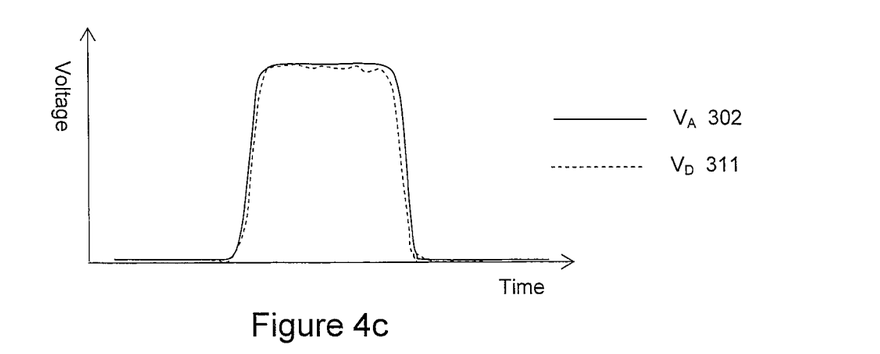
FIG. 4c is an illustration of an example waveform depicting a read or verify voltage pulse applied to an example embodiment of a PCMS cell to sense a state of the cell.

FIG. 4c is an illustration of an example waveform depicting a read or verify voltage pulse applied to an example embodiment of a PCMS cell to sense a state of the cell. As depicted in FIG. 4c, a voltage pulse applied to node 302 is illustrated by a solid line. A dotted line represents a voltage level observed at node 311 during the voltage pulse applied to node 302. For the example of FIG. 4c, it may be noticed that a voltage drop at node 311 occurs approximately at a point in time towards the end of a period of time defined by the read or verify pulse observed at node 302. For this particular example, because a sensing window (not depicted in FIG. 4c) may occur in an embodiment within time boundaries defined by the pulse period, and because the threshold event occurs approximately at the end of the pulse period, a sensing unit such as sensing circuit 340 may not successfully detect the threshold event, and sensed cell state signal 335 may incorrectly represent the state of PCMS cell 310. As noted previously, embodiments described herein may guard against a sensing circuit failing to detect a threshold event, as discussed further below.

FIG. 5 is an illustration of an example waveform of a read or verify voltage pulse 510 applied to an example embodiment of a PCMS cell and of an illustration of an example sensing window 520. In an embodiment, to guard against a sensing circuit failing to detect a threshold event for a PCMS cell, sensing window 520 may be extended beyond the end of read or verify pulse 510, a sensing circuit such as sensing circuit 340 depicted in FIG. 3, may detect a threshold event for the PCMS cell occurring at any time in response to read or verify pulse 510. For example, if a threshold event occurs towards the beginning of read or verify pulse 510, the voltage level at node 302, depicted in FIG. 3, for example, may maintain a conductive state in PCMS cell 310, and current may continue to flow throughout a remainder of the read or verify pulse time period, allowing sensing circuit 340 time to detect the threshold event signified by the flowing current.

Continuing to refer to FIG. 5, a further example may be considered. In an additional example, a threshold event for PCMS cell 310 may occur at a point in time towards the end of read or verify pulse 510. For this example, because sensing window 520 is extended beyond the end of read or verify pulse 510, sensing circuit 340 may continue to be enabled, and may successfully detect the threshold event occurring at the point in time towards the end of read or verify pulse 510. Of course, the points in time for the threshold events described in connection with FIG. 5 are merely examples, and the scope of claimed subject matter is not limited in this respect.

Figure 6A:
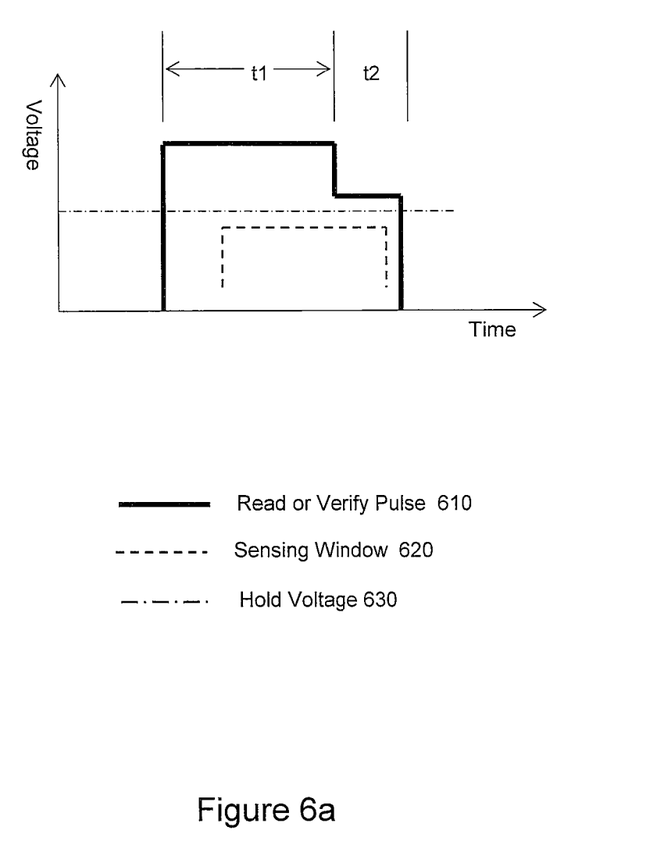
FIG. 6a is an illustration of an example waveform of a read or verify voltage pulse applied to an example embodiment of a PCMS cell and of an example sensing window.

FIG. 6a is an illustration of an example waveform of a read or verify voltage pulse 610 applied to an example embodiment of a PCMS cell such as cell 310 and of an example sensing window 620. In an embodiment, read or verify pulse 610 may have a first voltage level for a first period of time t1, and may be reduced to a second voltage level for a second period of time t2. Sensing window 620 may open during the first time period, and may close during the second time period. Also for an embodiment, the second voltage level of pulse 610 may comprise a voltage level less than that of the first voltage level, and may comprise a voltage level greater than hold voltage 630. In an embodiment, the first voltage level may be sufficient to result in a threshold event in a PCMS cell. Also, for an embodiment, hold voltage 630 may comprise a voltage level sufficient to maintain a conductive state in a PCMS cell such as cell 310, wherein the PCMS cell previously experienced a threshold event during the first time period.

For the example embodiment depicted in FIG. 6a, by dropping the voltage level of read or verify pulse 610 before sensing window 620 closes, and by maintaining a voltage on PCMS cell 310 sufficient to maintain current flow, sensing circuit 340 may have sufficient time to detect a threshold event, no matter when the threshold event occurs with respect to the first period of time t1. A threshold event may not occur during the second period of time t2 because the second voltage level during the second period of time t2 is not sufficient, in an embodiment, to trigger a threshold event. In this manner, sensing circuit 340 may correctly sense a state of PCMS cell 310, and that state may be reflected in a value of sensed cell state signal 335, in an embodiment. Of course, the periods of time, the points in time, and voltage levels described with respect to example embodiments related to FIG. 6a are merely examples, and the scope of claimed subject matter is not limited in these respects.

Although the transition from the first voltage level to the second voltage level for the example depicted in FIG. 6a is depicted as an idealized waveform, with a quick transition from one voltage level to the next, the scope of claimed subject matter is not limited in this respect. Waveforms depicted in FIG. 6a, as well as waveforms depicted in other figures, may be idealized for ease of discussion. However, embodiments in accordance with claimed subject matter may utilize waveforms with more gradual transitions or with voltage levels that may vary, for example. For the example depicted in FIG. 6a, as well as for examples depicted in FIGS. 6b-6d, described below, read or verify pulse 610 may reach the first voltage level at the beginning of the first period of time, and may begin to ramp down to the second voltage level at the end of the first period of time, in an embodiment. In an embodiment, a transition from the first voltage level to the second voltage level may comprise a relatively gradual transition, although the scope of claimed subject matter is not limited in this respect.

Figure 6B:
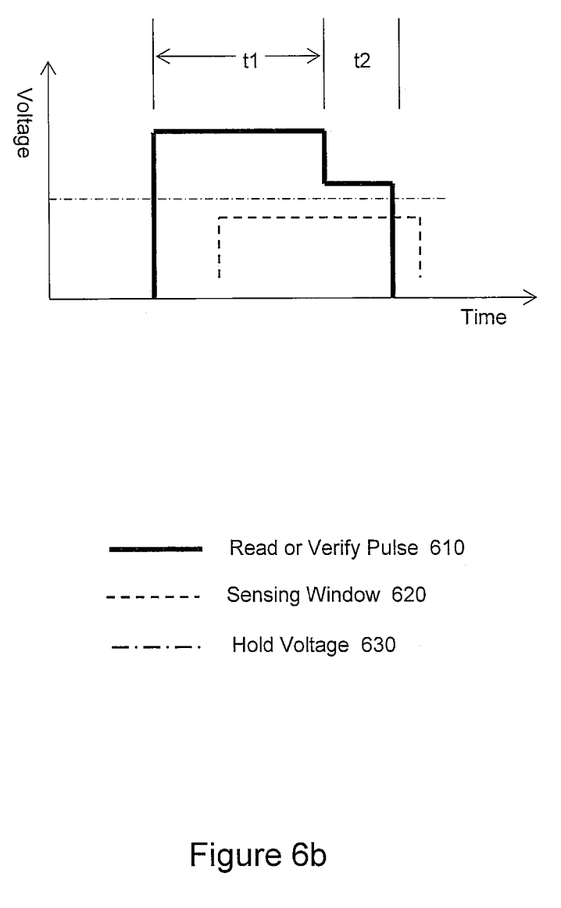
FIG. 6b is an illustration of an example waveform of a read or verify voltage pulse applied to an example embodiment of a PCMS cell and of an example sensing window.

FIG. 6b is an illustration of an additional example waveform of read or verify voltage pulse 610 applied to an example embodiment of a PCMS cell such as cell 310 and of an additional example sensing window 620. As with the example described above in connection with FIG. 6a, read or verify pulse 610 for the example depicted in FIG. 6b may have a first voltage level for a first period of time t1, and may be reduced to a second voltage level for a second period of time t2. Sensing window 620 may open during the first time period, and for an example embodiment may close at a point in time after the second time period. Also for an embodiment, the second voltage level of pulse 610 may comprise a voltage level less than that of the first voltage level, and may comprise a voltage level greater than a hold voltage 630. In an embodiment, the first voltage level may be sufficient to result in a threshold event in a PCMS cell. Also, for an embodiment, hold voltage 630 may comprise a voltage level sufficient to maintain a conductive state in a PCMS cell such as cell 310, wherein the PCMS cell previously experienced a threshold event during the first time period.

For the example embodiment depicted in FIG. 6b, as with the example above depicted in FIG. 6a, by dropping the voltage level of read or verify pulse 610 before sensing window 620 closes, and by maintaining a voltage on PCMS cell 310 sufficient to maintain current flow, sensing circuit 340 may have sufficient time to detect a threshold event, no matter when the threshold event occurs with respect to the first period of time t1. A threshold event may not occur during the second period of time t2 because the second voltage level during the second period of time t2 may not be sufficient, in an embodiment, to trigger a threshold event. Also, for an embodiment, because sensing window 620 is extended beyond the end of read or verify pulse 610, sensing circuit 340 may continue to be enabled, and may successfully detect the threshold event occurring at the point in time towards the end of the first period of time t1, and the chances of a successful detection of a threshold event may be increased. Of course, the periods of time, the points in time, and voltage levels described with respect to example embodiments related to FIG. 6b are merely examples, and the scope of claimed subject matter is not limited in these respects.

Figure 6C:
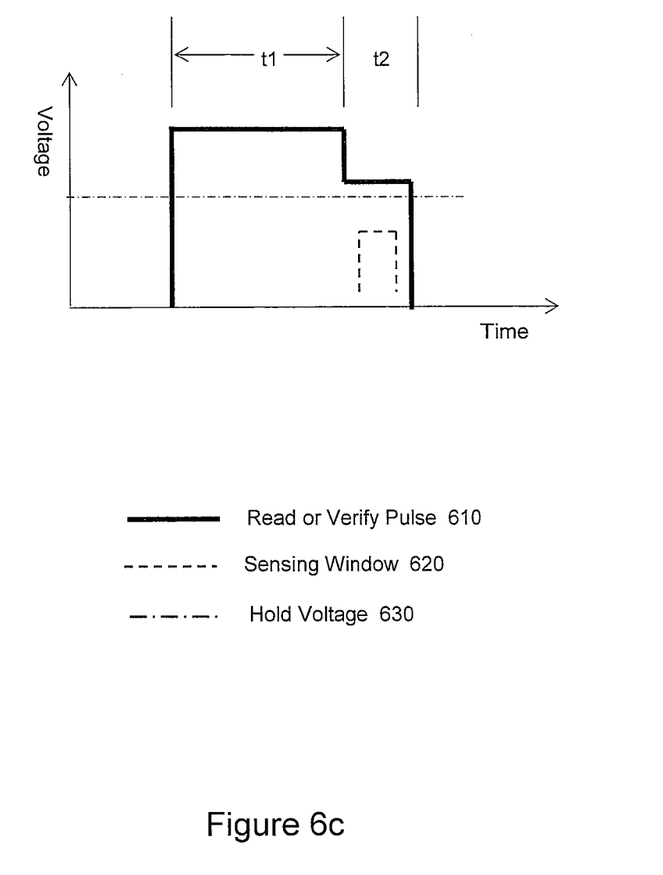
FIG. 6c is an illustration of an example waveform of a read or verify voltage pulse applied to an example embodiment of a PCMS cell and of an example sensing window.

FIG. 6c is an illustration of an additional example waveform of read or verify voltage pulse 610 applied to an example embodiment of a PCMS cell such as cell 310 and of an additional example sensing window 620. As with the examples described above in connection with FIGS. 6a and 6b, read or verify pulse 610 for the example depicted in FIG. 6c may have a first voltage level for a first period of time t1, and may be reduced to a second voltage level for a second period of time t2. For an embodiment, sensing window 620 may not open until after the beginning of the second period of time t2, and for an example embodiment may close at a point in time before the end of the second period of time t2. Also for an embodiment, as with the examples described above in connection with FIGS. 6a and 6b, the second voltage level of pulse 610 may comprise a voltage level less than that of the first voltage level, and may comprise a voltage level greater than a hold voltage 630. In an embodiment, the first voltage level may be sufficient to result in a threshold event in a PCMS cell. Also, for an embodiment, hold voltage 630 may comprise a voltage level sufficient to maintain a conductive state in a PCMS cell such as cell 310, wherein the PCMS cell previously experienced a threshold event during the first time period. Of course, the periods of time, the points in time, and voltage levels described with respect to example embodiments related to FIG. 6c are merely examples, and the scope of claimed subject matter is not limited in these respects.

Figure 6D:
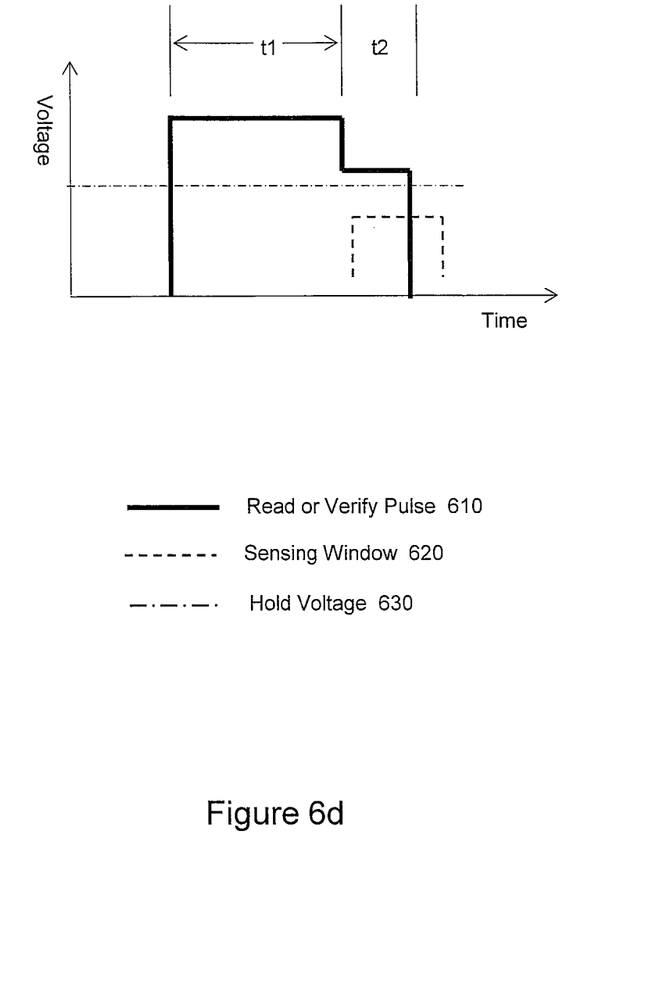
FIG. 6d is an illustration of an example waveform of a read or verify voltage pulse applied to an example embodiment of a PCMS cell and of an example sensing window.

FIG. 6d is an illustration of an additional example waveform of read or verify voltage pulse 610 applied to an example embodiment of a PCMS cell such as cell 310 and of an additional example sensing window 620. As with the examples described above in connection with FIGS. 6a-6c, read or verify pulse 610 for the example depicted in FIG. 6d may have a first voltage level for a first period of time t1, and may be reduced to a second voltage level for a second period of time t2. For an embodiment, sensing window 620 may not open until after the beginning of the second period of time t2, and for an example embodiment may close at a point in time after the second period of time t2. Also for an embodiment, as with the examples described above in connection with FIGS. 6a-6c, the second voltage level of pulse 610 may comprise a voltage level less than that of the first voltage level, and may comprise a voltage level greater than a hold voltage 630. In an embodiment, the first voltage level may be sufficient to result in a threshold event in a PCMS cell. Also, for an embodiment, hold voltage 630 may comprise a voltage level sufficient to maintain a conductive state in a PCMS cell such as cell 310, wherein the PCMS cell previously experienced a threshold event during the first time period. Of course, the periods of time, the points in time, and voltage levels described with respect to example embodiments related to FIG. 6d are merely examples, and the scope of claimed subject matter is not limited in these respects.

Figure 7:
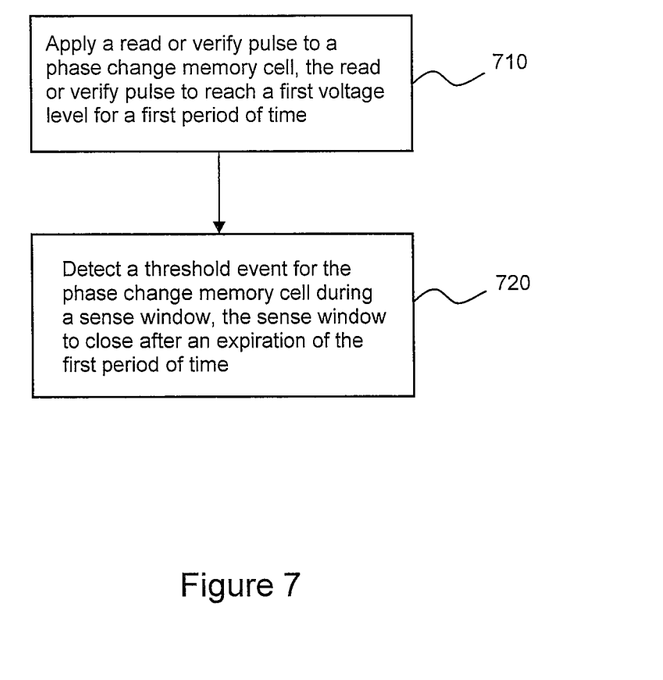
FIG. 7 is a flow diagram illustrating an example embodiment of a process for sensing a state of a an example embodiment of a PCMS cell.

FIG. 7 is a flow diagram illustrating an example embodiment of a process for sensing a state of an example embodiment of a PCMS cell, such as cell 310 depicted in FIG. 3. At block 710, a read or verify pulse may be applied to a phase change memory cell. A voltage level of the read or verify pulse may reach a first voltage level for a first period of time. At block 720, a threshold event may be detected for the PCMS cell during a sense window. In an embodiment, the sense window may close at a point in time after an expiration of the first period of time. Further, in an embodiment, the first voltage level may comprise a voltage level sufficient to result in the threshold event if the phase change memory cell is in a substantially crystalline state. Embodiments in accordance with claimed subject matter may include all, less than, or more than, blocks 710 and 720. Further, the order of blocks 710 and 720 is merely an example, and the scope of claimed subject matter is not limited in this respect.

In a further embodiment, a read or verify pulse may be reduced to a voltage level lower than the first voltage level and greater than a second voltage level for a second period of time following the first period of time, such as depicted in FIGS. 6a-6d and as discussed above. The second voltage level may comprise a voltage level sufficient to maintain a conductive state of the phase change memory cell if the memory cell was previously thresholded during the first period of time.

Additionally, in various embodiments, a sense window may open and close at various points in time. For example, a sense window may open at a point during the first period of time, and may close during the second period of time. For another example, a sense window may open during the first period of time and may not close until after the end of the second period of time. For an additional embodiment, a sense window may open and then close within the second period of time. Further, for another example embodiment, a sense window may open during the second period of time, and may close at a point in time after the end of the second period of time. See, for example, the example sense windows 620 depicted in FIGS. 6a-6d. Of course, the points in time and period of time described herein are merely examples, and the scope of claimed subject matter is not limited in these respects.

In one or more embodiments, a threshold event may be detected at least in part by detecting an increase in current through a PCMS cell. In other embodiments, a threshold event may be detected at least in part by detecting a voltage drop across a load, for example, or by comparing a voltage observed at a memory cell node with a reference voltage. However, the scope of claimed subject matter is not limited in these respects.

FIG. 8 is an example chart depicting an example current vs. voltage curve for an example PCMS cell. For the example depicted in FIG. 8, the current values are depicted on a logarithmic scale. As can be seen in FIG. 8, two curves are shown, a curve 810 for an example PCMS cell in a set state and a curve 820 for an example PCMS cell in a reset state 820. For both cases, an increase in voltage across a cell may be met with an increase in current, up until a point where the cell thresholds. Threshold current $I_T$ 801 for an example PCMS cell is depicted. At the threshold point, current may begin to flow through an example PCMS cell more readily. For an example PCMS cell in a set state, a threshold event may occur at a voltage level at or above Vset 803. For an example PCMS cell in a reset state, a threshold event may occur at a voltage level or above Vreset 805. Of course, these are merely example voltage and current levels, and the scope of claimed subject matter is not limited in this respect.

Because of the difference in voltage levels between threshold events for the PCMS cell in a set state as compared to the cell in a reset state, a threshold detection circuit may be designed to detect a threshold event for a cell in a set state without triggering a threshold event if the cell is in a reset state. This may be accomplished by an appropriate selection of a voltage level for the read or verify pulse. A read or verify pulse voltage level may be selected to be sufficient in magnitude to trigger a threshold event if a cell is in a set state, but insufficient in magnitude to cause a threshold event if the cell is in a reset state. In this manner, a read or verify pulse may be applied to a PCMS cell, and if a threshold event is detected, a set state for the cell may be indicated. If no threshold event is detected, a reset state may be indicated.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and" and "or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method, comprising:
    applying a read or verify pulse to a phase change memory cell, wherein the read or verify pulse reaches approximately a first voltage level for a first period of time; and
    detecting a threshold event for the phase change memory cell during a sense window, wherein the sense window is a time period for which a sensing circuit is configured to detect the threshold event,
    wherein the sense window opens after the read or verify pulse reaches the first voltage level, wherein the read or verify pulse is at or below the first voltage level while the sense window is open, and wherein the sense window closes after an expiration of the first period of time.

2. The method of claim 1, wherein the first voltage level comprises a voltage level sufficient to result in the threshold event if the phase change memory cell is in a substantially crystalline state and insufficient to result in the threshold event if the phase change memory cell is in a substantially amorphous state.

3. The method of claim 2, further comprising reducing the read or verify pulse to a voltage level lower than the first voltage level and equal to or greater than a second voltage level for a second period of time following the first period of time, wherein the second voltage level comprises a voltage level sufficient to maintain a conductive state of the phase change memory cell.

4. The method of claim 3, wherein the sense window closes at a second point in time after the expiration of the first period of time and before an expiration of the second period of time or at a point in time after the expiration of the second period of time.

5. The method of claim 4, wherein the sense window opens at a point in time before the expiration of the first period of time or at a point in time during the second period of time.

6. The method of claim 1, wherein said detecting the threshold event comprises detecting an increase in current through the phase change memory cell.

7. The method of claim 1, wherein said detecting the threshold event comprises detecting an increase in voltage across a load resistor configured in series with the phase change memory cell.

8. The method of claim 1, wherein the sense window is opened after the read or verify pulse has been reduced to a second voltage level that is less than the first voltage level.

9. The method of claim 8, wherein the second voltage level is greater than a hold voltage, wherein the hold voltage comprises a voltage level sufficient to maintain a conductive state in a PCMS cell.

10. An apparatus, comprising:
    a phase change memory cell;
    a control circuit for controlling an application of a read or verify pulse to the phase change memory cell, wherein the read or verify pulse reaches a first voltage level for a first period of time; and
    a sensing circuit for detecting a threshold event for the phase change memory cell during a sense window, wherein the sense window is a time period for which the sensing circuit is configured to detect the threshold event,
    wherein the sensing circuit is configured to open the sense window after the read or verify pulse reaches the first voltage level, wherein the control circuit is configured to maintain the read or verify pulse at or below the first voltage level while the sense window is open, and wherein the sensing circuit is configured to close the sense window after an expiration of the first period of time.

11. The apparatus of claim 10, wherein the first voltage level comprises a voltage level sufficient to result in the threshold event if the phase change memory cell is in a substantially crystalline state.

12. The apparatus of claim 11, wherein the control circuit is configured to reduce the read or verify pulse to a voltage level lower than the first voltage level and greater than a second voltage level for a second period of time following the first period of time, wherein the second voltage level comprises a voltage level sufficient to maintain a conductive state of the phase change memory cell.

13. The apparatus of claim 12, wherein the control circuit is configured to close the sense window at a second point in time after the expiration of the first period of time and before an expiration of the second period of time or at a point in time after the expiration of the second period of time.

14. The apparatus of claim 13, wherein the control circuit is configured to open the sense window at a point in time before the expiration of the first period of time or at a point in time during the second period of time.

15. The apparatus of claim 10, wherein the sensing circuit is configured to detect the threshold event at least in part by detecting an increase in current through the phase change memory cell.

16. The apparatus of claim 10, wherein the sensing circuit is configured to detect the threshold event at least in part by detecting an increase in voltage across a load resistor configured in series with the phase change memory cell.

* * * * *